(12) United States Patent
Shim et al.

(10) Patent No.: US 10,921,357 B2
(45) Date of Patent: Feb. 16, 2021

(54) METHOD AND APPARATUS FOR MEASURING RESISTANCE OF LIGHT EMITTING DIODE

(71) Applicant: INDUSTRY-UNIVERSITY COOPERATION FOUNDATION HANYANG UNIVERSITY ERICA CAMPUS, Ansan-si (KR)

(72) Inventors: Jong-In Shim, Seoul (KR); Dong Pyo Han, Gyeonggi-do (KR); Dong-Soo Shin, Gyeonggi-do (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 372 days.

(21) Appl. No.: 15/575,894

(22) PCT Filed: Feb. 18, 2016

(86) PCT No.: PCT/KR2016/001644
§ 371 (c)(1),
(2) Date: Nov. 21, 2017

(87) PCT Pub. No.: WO2016/190523
PCT Pub. Date: Dec. 1, 2016

(65) Prior Publication Data
US 2018/0143231 A1    May 24, 2018

(30) Foreign Application Priority Data

May 22, 2015 (KR) ........................ 10-2015-0071767

(51) Int. Cl.
*G01R 27/08* (2006.01)
*G01R 31/26* (2020.01)
(Continued)

(52) U.S. Cl.
CPC ............ *G01R 27/08* (2013.01); *G01R 19/10* (2013.01); *G01R 19/2506* (2013.01);
(Continued)

(58) Field of Classification Search
CPC ........ G01R 27/08; G01R 31/26; G01R 31/44; G01R 19/10; G01R 19/25; G01N 21/64; G06F 15/00
See application file for complete search history.

(56) References Cited

U.S. PATENT DOCUMENTS

2004/0135522 A1* 7/2004 Berman ................. H05B 45/20
315/291
2011/0178770 A1 7/2011 Shim et al.
2015/0323463 A1* 11/2015 Shim .................. G01R 31/2635
702/182

FOREIGN PATENT DOCUMENTS

JP    2011-169719 A    9/2011
KR    10-2005-0034140 A    4/2005
(Continued)

OTHER PUBLICATIONS

Il-Gyun Choi, "Dominant Carrier Recombination Mechanisms in InGaN/GaN Light-Emitting Diodes by Separating Radiative and Nonradiative Current Components," Department of Electronics and Communication Engineering, The Graduate School Hanyang University, Feb. 2013, 50 pages.
(Continued)

*Primary Examiner* — Neel D Shah
(74) *Attorney, Agent, or Firm* — Sughrue Mion, PLLC (57) ABSTRACT

Disclosed are a method and device for measuring the resistance of a light-emitting diode that can measure the resistance value of the light-emitting diode accurately in a non-destructive manner. The disclosed method may include: measuring a first radiative current component of an injected current for the light-emitting diode by using the internal
(Continued)

quantum efficiency of the light-emitting diode; generating a second radiative current component by modeling the first radiative current component; and computing a resistance value of the light-emitting diode by using the first and second radiative current components resulting from an applied voltage to the light-emitting diode.

3 Claims, 9 Drawing Sheets

(51) Int. Cl.
*G01R 31/44* (2020.01)
*G01R 19/10* (2006.01)
*G01R 19/25* (2006.01)
*G01J 1/44* (2006.01)
*G01J 1/42* (2006.01)

(52) U.S. Cl.
CPC ......... *G01R 31/2635* (2013.01); *G01R 31/44* (2013.01); *G01J 1/44* (2013.01); *G01J 2001/4252* (2013.01)

(56) References Cited

FOREIGN PATENT DOCUMENTS

| KR | 10-2011-0083871 A | 7/2011 |
| KR | 10-2014-0017440 A | 2/2014 |
| KR | 10-2015-0043583 A | 4/2015 |

OTHER PUBLICATIONS

International Search Report of PCT/KR2016/001644 dated Jun. 9, 2016.

\* cited by examiner

METHOD AND APPARATUS FOR MEASURING RESISTANCE OF LIGHT EMITTING DIODE

CROSS-REFERENCE TO RELATED APPLICATIONS

This application is a National Phase Application of PCT International Application No. PCT/KR2016/001644, which was filed on Feb. 18, 2016, and which claims priority from Korean Patent Application No. 10-2015-0071767 filed with the Korean Intellectual Property Office on May 22, 2015. The disclosures of the above patent applications are incorporated herein by reference in their entirety.

BACKGROUND

1. Technical Field

The present invention relates to a method and device for measuring the resistance of a light emitting diode, more particularly to a method and device for measuring the resistance values of the light emitting diode for the radiative current component and the non-radiative current component of the injected current.

2. Description of the Related Art

The light-emitting diode (LED) is widely being used as a light source recognized for its small size, low power consumption, and high reliability. A light-emitting diode may use a compound semiconductor such as AlGaAs, GaAlP, GaP, InGaAlP, GaN, etc. A light-emitting diode may include an N-type semiconductor layer that includes the compound semiconductor, an activation layer positioned over the N-type semiconductor layer, and a P-type semiconductor layer positioned over the activation layer. The light-emitting diode is a sort of p-n junction diode and is a semiconductor element that utilizes electroluminescence, which describes the phenomenon of monochromatic light being emitted when a voltage is applied in a forward direction.

The resistance component of a typical light-emitting diode may be calculated by measuring the slope of the voltage-current curve of the light-emitting diode or by mathematically approximating the value of the resistance component from the voltage-current curve by using the Shockley diode equation. From among the above methods of measuring resistance, the method of using the slope of the diode's voltage-current curve is vulnerable to very large changes in the resistance component value depending on the magnitude of the injected current and cannot express the voltage drop caused by an accurate resistance component of the light-emitting diode. The method using the Shockley diode equation also poses a difficulty in accurately measuring the resistance component due to the uncertainty which the Shockley diode equation itself entails.

Measuring of the resistance component of a light-emitting diode is related to the issues of increasing the efficiency of the light-emitting diode element itself and determining whether a problem is due to a problem in the circuit of the product in which the light-emitting diode is mounted or a problem in the light-emitting diode element itself. As such, there is a need for a method of accurately measuring the resistance component of a light-emitting diode.

SUMMARY OF THE INVENTION

An aspect of the invention is to provide a method and device for measuring the resistance of a light-emitting diode that can measure the resistance value of the light-emitting diode accurately in a non-destructive manner.

To achieve the objective above, an embodiment of the invention provides a method for measuring the resistance of a light-emitting diode, where the method includes: measuring a first radiative current component of an injected current for the light-emitting diode by using the internal quantum efficiency of the light-emitting diode; generating a second radiative current component by modeling the first radiative current component; and computing a resistance value of the light-emitting diode by using the first and second radiative current components resulting from an applied voltage to the light-emitting diode.

Another embodiment of the invention provides a method for measuring the resistance of a light-emitting diode, where the method includes: measuring a first non-radiative current component of an injected current for the light-emitting diode by using the internal quantum efficiency of the light-emitting diode; generating a second non-radiative current component by modeling the first non-radiative current component; and computing a resistance value of the light-emitting diode by using the first and second non-radiative current components resulting from an applied voltage to the light-emitting diode.

Yet another embodiment of the invention provides a device for measuring the resistance of a light-emitting diode, where the device includes: a current component separation part configured to separate an injected current for the light-emitting diode into a radiative current component and a non-radiative current component by using the internal quantum efficiency of the light-emitting diode; and a resistance value computation part configured to compute the resistance value for the radiative current component or the resistance value for the non-radiative current component.

An embodiment of the invention can compute the resistance value by separating the injected current for a light-emitting diode into a radiative current component and a non-radiative current component, so that the resistance value of the light-emitting diode can be measured in a non-destructive manner.

Also, an embodiment of the invention makes it possible to ascertain whether the resistance value of a light-emitting diode was influenced more by the manufacturing process or by the semiconductor crystal growth process.

Also, an embodiment of the invention makes it possible to ascertain whether a problem is due to a problem in the light-emitting diode element itself or due to a problem in the circuit, and if it is due to the problem in the light-emitting diode element itself, whether the problem arose from the manufacturing process or from the element itself.

DETAILED DESCRIPTION OF THE INVENTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are assigned to like elements.

Certain embodiments of the present invention are described below in more detail with reference to the accompanying drawings.

Figure 1:
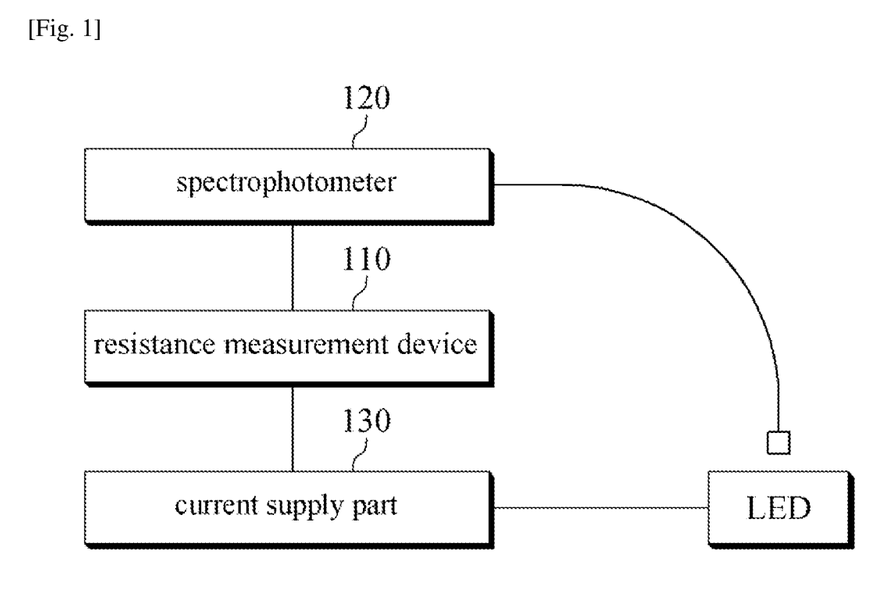
FIG. 1 illustrates a system for measuring the resistance of a light-emitting diode according to an embodiment of the invention.

FIG. 1 illustrates a system for measuring the resistance of a light-emitting diode according to an embodiment of the invention.

As illustrated in FIG. 1, a system for measuring the resistance of a light-emitting diode (LED) according to an embodiment of the invention may include a resistance measurement device 110, a spectrophotometer 120, and a current supply part 130.

A resistance measurement device 110 according to an embodiment of the invention may use the internal quantum efficiency of the light-emitting diode to separate the injected current provided to the light-emitting diode into a radiative current component and a non-radiative current component and may compute the resistance value for each of the radiative current and the non-radiative current.

The internal quantum efficiency is defined as the proportion of the number of photons generated at the activation layer of the light-emitting diode per unit time with respect to the number of electrons injected to the light-emitting diode per unit time. A portion of the electrons injected to the light-emitting diode recombine with electron holes and lose energy in the form of photons, while another portion may recombine with electron holes and lose energy in the form of thermal energy. Ultimately, the internal quantum efficiency represents the proportion of electrons that are used for the emission of light from among the electrons injected to the light-emitting diode.

Therefore, if the internal quantum efficiency of the light-emitting diode is known, the injected current can be separated into the radiative current component, which is used for light emission by the light-emitting diode, and the non-radiative current component, which is not used for light emission.

The current supply part 130 can provide a current to the light-emitting diode, where the intensity of the current can be varied according to the control by the resistance measurement device 110. The injected current provided from the current supply part 130 may cause the light-emitting diode to emit light, and the spectrophotometer 120 may measure the intensity of the spontaneous emission of the light-emitting diode and provide the measured value to the resistance measurement device 110.

The resistance measurement device 110 can calculate the internal quantum efficiency of the light-emitting diode by using the measured value of the spontaneous emission and can measure the radiative current component and non-radiative current component of the injected current by using the internal quantum efficiency. Also, the resistance measurement device 110 may compute the resistance value for the radiative current component or the non-radiative current component. Here, the resistance value for the radiative current component is the resistance value that is influenced by the manufacturing process, while the resistance value for the non-radiative current component is the resistance value that is influenced by the growth of the semiconductor crystal. If a light-emitting diode were expressed as an equivalent circuit composed of resistors, the resistance value for the radiative current component could correspond to a serial resistor, and the resistance value for the non-radiative current component could correspond to an additional resistor other than the serial resistor.

The resistance measurement device 110 can compute the resistance for the radiative current component and the non-radiative current component by using the difference in voltage between measured values and modeling results for the radiative current component and non-radiative current component. For example, if the radiative current component and the non-radiative current component are modeled with an ideal Shockley diode equation that does not consider voltage drops caused by the resistance component, the resistance component can be computed by comparing the modeled results with measurement values for the radiative current component and non-radiative current component in which the voltage drop phenomenon is present, since the voltage drop is caused by the resistance component.

According to an embodiment of the invention, the injected current for the light-emitting diode can be separated into the radiative current component and the non-radiative current component in computing the resistance value, so that the resistance value of the light-emitting diode can be measured in a non-destructive manner. It is also made possible to ascertain whether the resistance value of the light-emitting diode was influenced more by the manufacturing process or by the semiconductor crystal growth process.

A product having a light-emitting diode mounted therein can have its performance lowered according to the internal resistance of the product, and an embodiment of the invention makes it possible to ascertain whether a problem is due to a problem in the light-emitting diode element itself or due to a problem in the circuit, and if there is a problem in the light-emitting diode element itself, whether the problem arose from the manufacturing process or from the element itself. Performing such diagnosis can provide aid in new LED designs.

According to different embodiments, the resistance measurement device 110 can include both the spectrophotometer 120 and the current supply part 130 or can be provided with information on the internal quantum efficiency of the light-emitting diode measured separately.

Figure 2:
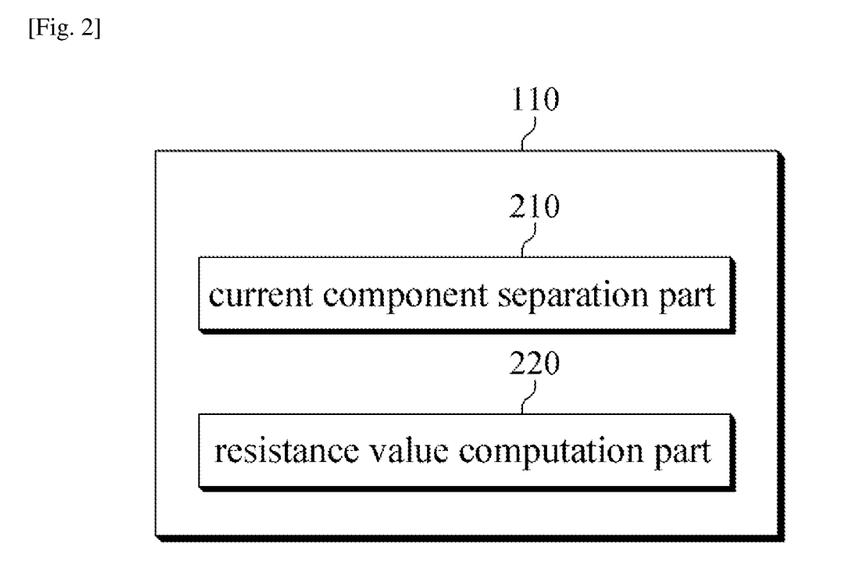
FIG. 2 illustrates a device for measuring resistance according to an embodiment of the invention.

FIG. 2 illustrates a device for measuring resistance according to an embodiment of the invention.

As illustrated in FIG. 2, a resistance measurement device 110 according to an embodiment of the invention may include a current component separation part 210 and a resistance value computation part 220.

The current component separation part 210 may separate the injected current for the light-emitting diode into the radiative current component and the non-radiative current component by using the internal quantum efficiency of the light-emitting diode. Also, the resistance value computation part 220 may compute the resistance value for the radiative current component or the resistance value for the non-radiative current component.

Although it is not represented in the drawings, the resistance value computation part 220 can include a modeling part and an approximation part. The modeling part can, in one example, perform the modeling by using a Shockley diode equation and can model the radiative current component or the non-radiative current component by using the ideality factor of the radiative current component or the non-radiative current component determined in a preconfigured injected current region. The approximation part may compute the resistance value for the radiative current component or the non-radiative current component by approximating the difference between the voltage resulting from the radiative current component or non-radiative current component and the voltage obtained as a result of the modeling.

A more detailed description of a resistance measurement device 110 according to an embodiment of the invention is provided below, with reference to FIG. 3 through FIG. 10. As an example, a method of measuring the resistance of a light-emitting diode is described, where the light-emitting diode is a nitride-based light-emitting diode having a central wavelength of 450 nm.

The current component separation part 210 can measure the radiative current component ($I_R$) or the non-radiative current component ($I_{NR}$) as a product of the internal quantum efficiency (IQE) and the injected current (I), and in one example, can utilize [Equation 1] below.

$$I_R = IQE \cdot I$$

$$I_{NR} = (1-IQE) \cdot I \qquad \text{[Equation 1]}$$

Figure 3:
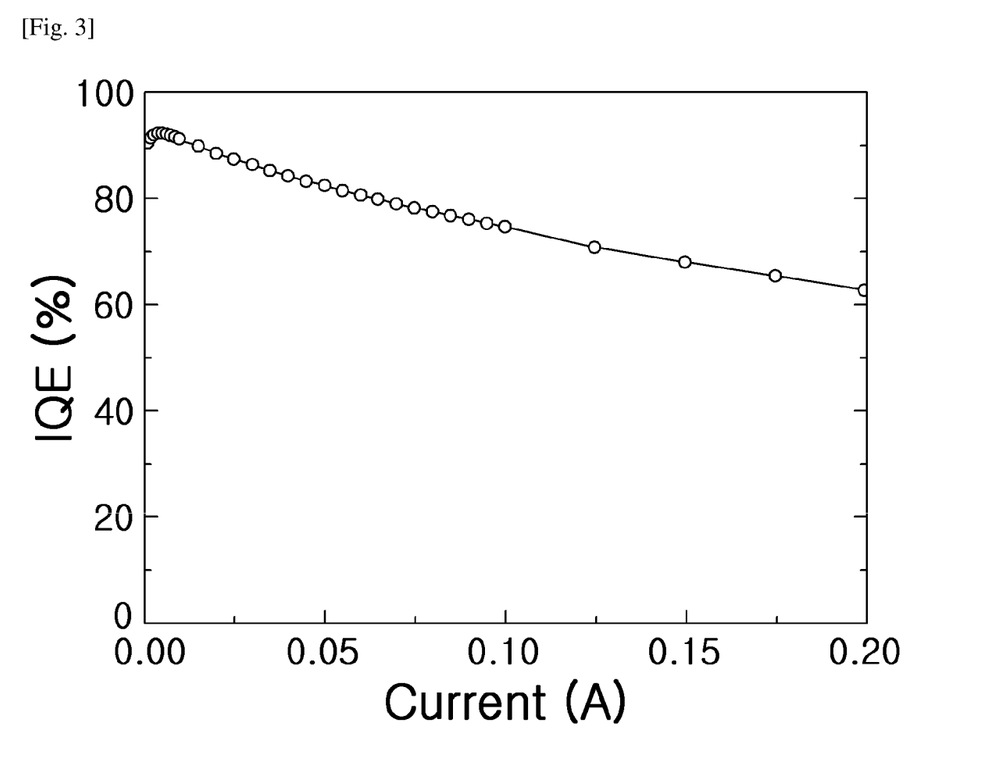
FIG. 3 is a graph representing internal quantum efficiency in relation to the injected current of a light-emitting diode.
Figure 4:
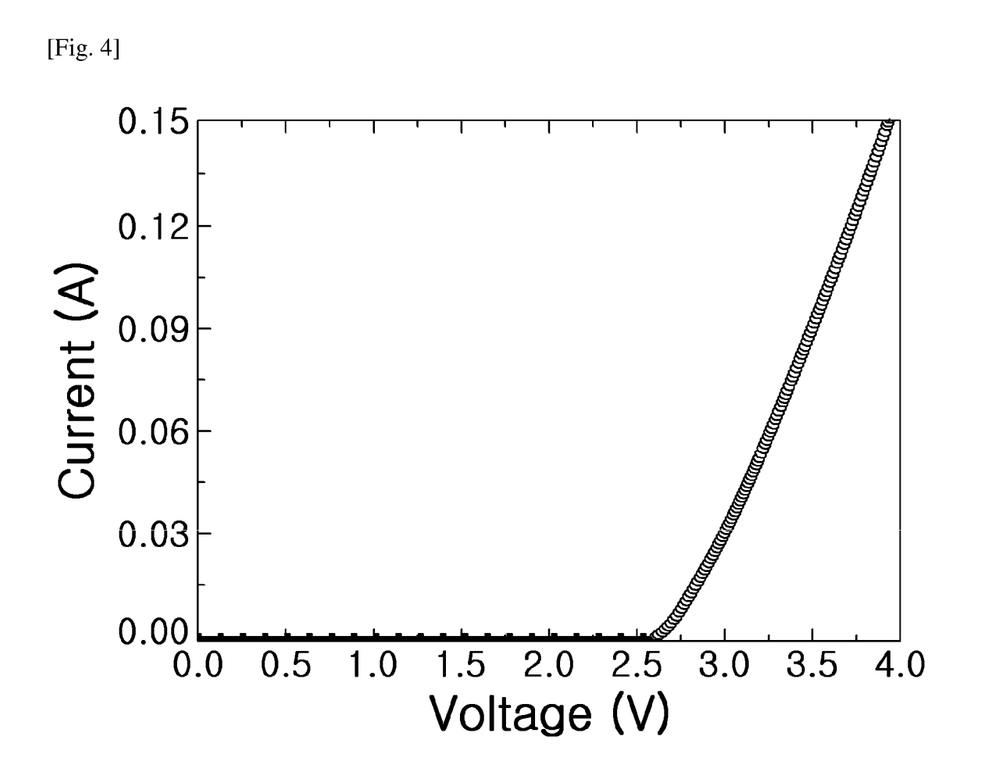
FIG. 4 is a graph representing the injected current in relation to the applied voltage of a light-emitting diode.
Figure 5:
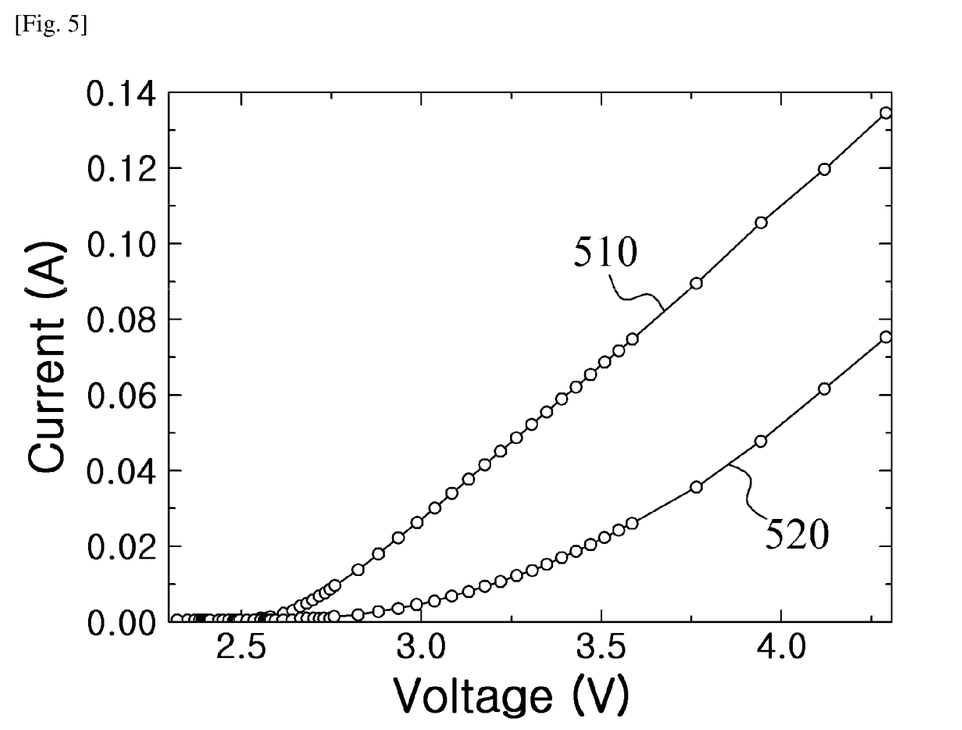
FIG. 5 is a graph representing the radiative current component and non-radiative current component included in the injected current.

The internal quantum efficiency with respect to the injected current of the light-emitting diode is as shown in FIG. 3, and when the injected current in relation to changes in the applied voltage of the light-emitting diode is as shown in FIG. 4, the radiative current component 510 and the non-radiative current component 520 included in the injected current can be expressed as shown in FIG. 5. Since an increase in the applied voltage leads to an increase in the injected current, an increase in the applied voltage leads to an increase in the radiative current component and the non-radiative current component as well.

The resistance value computation part 220 may compute the resistance value by modeling the radiative current component and the non-radiative current component as described above, and in one example, can perform the modeling by using the Shockley diode equation defined as [Equation 2]. Here, $I_S$ is the saturation current, q is the basic charge, n is the ideality factor, $k_B$ is the Boltzmann constant, T is absolute temperature, and V is the applied voltage.

$$I = I_S \exp\left[\frac{qV}{nk_BT}\right] \qquad \text{[Equation 2]}$$

Also, the resistance value computation part 220 may use an ideality factor selected from a preconfigured injected current region to model the radiative current component and non-radiative current component. The ideality factors for the radiative current component and the non-radiative current component can be obtained by differentiating the Shockley diode equation, and in one example, the ideality factors can be obtained using [Equation 3] shown below. Here, $n_R$ is the ideality factor for the radiative current component, and $n_{NR}$ is the ideality factor for the non-radiative current component.

$$n_R = \frac{q}{k_BT}\left(\frac{\partial \ln I_R}{\partial V}\right)^{-1}$$

$$n_{NR} = \frac{q}{k_BT}\left(\frac{\partial \ln I_{NR}}{\partial V}\right)^{-1} \qquad \text{[Equation 3]}$$

Figure 6:
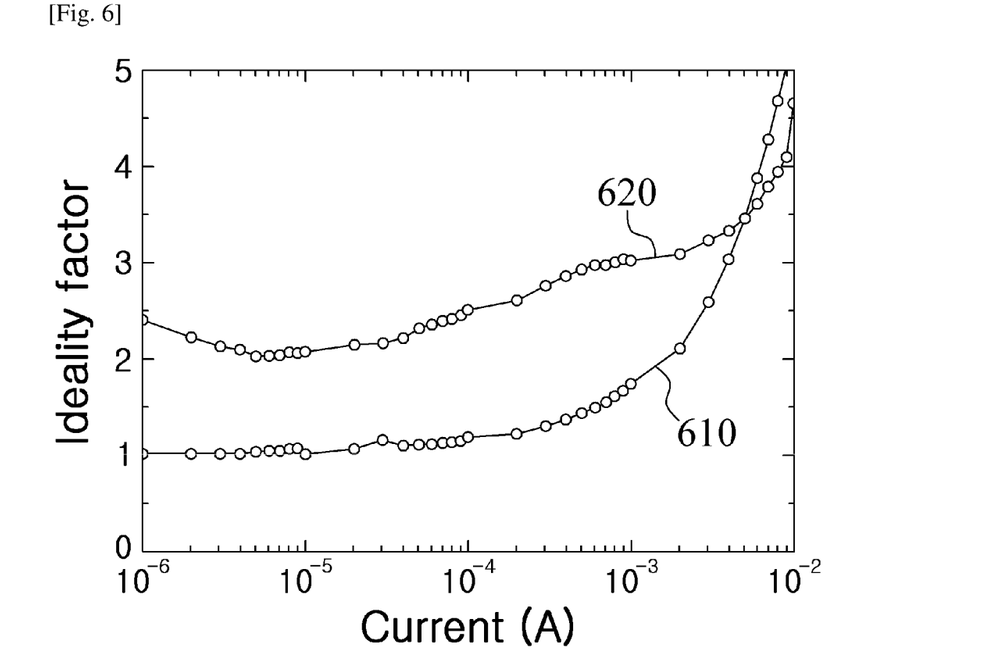
FIG. 6 is a graph representing the ideality factor obtained for the radiative current component and non-radiative current component in relation to the injected current.

The results of obtaining the ideality factors for the radiative current component and non-radiative current component in relation to the injected current by using [Equation 3] are as shown in FIG. 6. As illustrated in FIG. 6, the ideality factor 610 for the radiative current component shows a value of 1 in a low-current region where the current is lower than $10^{-4}$ A but increases with increasing injected current. Also, the ideality factor 620 for the non-radiative current component shows a value of 2 in a low-current region where the current is lower than $5 \times 10^{-5}$ A but increases with increasing injected current.

The increase in the ideality factor occurs according to the voltage drop phenomenon caused by the additional resistance components such as the parasitic resistance component, and since the Shockley diode equation used in an embodiment of the invention is an ideal equation that does not consider such voltage drops, the resistance value computation part 220 may perform modeling by using an ideality factor that is expressed as a constant value within a particular current region.

Thus, the resistance value computation part 220 can perform the modeling by making substitutions to the Shockley equation with the ideality factor for the radiative current component configured to 1 and the ideality factor for the non-radiative current component configured to 2, so that the radiative current component ($I_{R,Ideal}$) and the non-radiative current component ($I_{NR,Ideal}$) can be modeled as [Equation 4] shown below.

$$I_{R,Ideal} = I_{S,R}\exp\left[\frac{qV}{k_BT}\right]$$

$$I_{NR,Ideal} = I_{S,NR}\exp\left[\frac{qV}{2k_BT}\right] \qquad \text{[Equation 4]}$$

Figure 7:
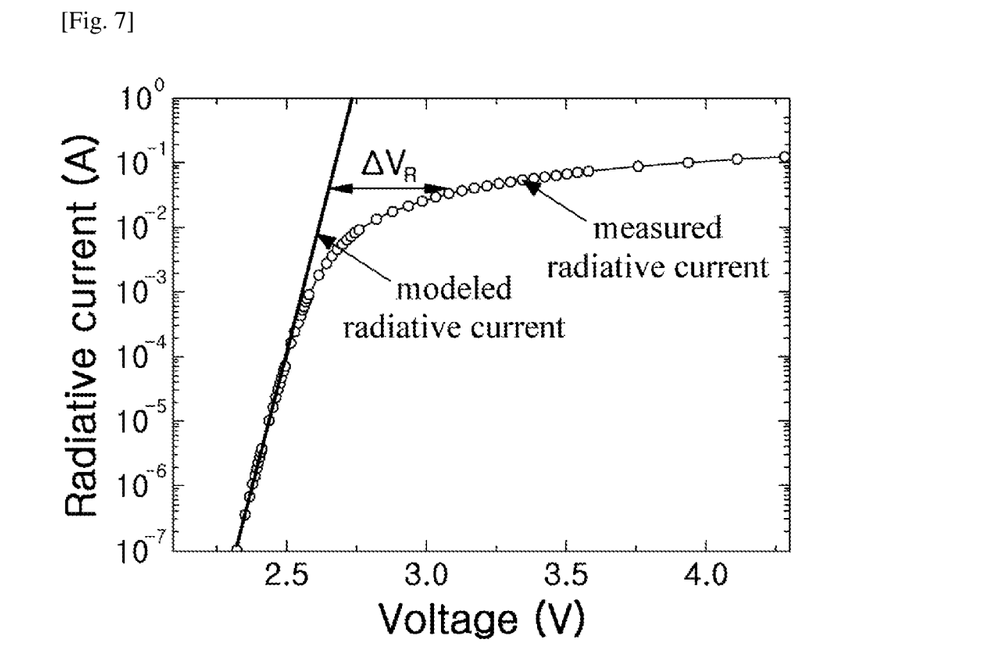
FIG. 7 is a graph representing the modeled radiative current component and the measured radiative current component in relation to the applied voltage.

As described above, the voltage difference between the modeled radiative current component or non-radiative current component and the actually measured radiative current component or non-radiative current component can be used to compute the resistance component. FIG. 7 is a graph representing the modeled radiative current component and the measured radiative current component in relation to the applied voltage, and FIG. 8 is a graph representing the modeled non-radiative current component and the measured non-radiative current component in relation to the applied voltage.

Figure 8:
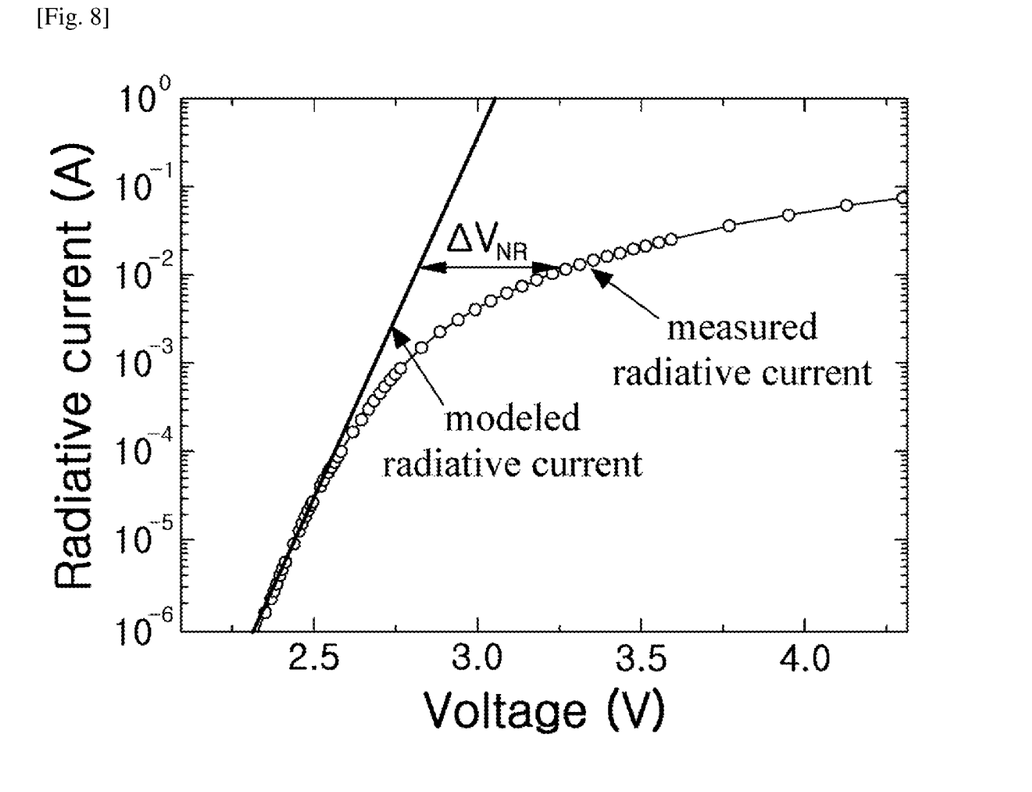
FIG. 8 is a graph representing the modeled non-radiative current component and the measured non-radiative current component in relation to the applied voltage.

As illustrated in FIG. 7 and FIG. 8, there is a voltage difference, and such voltage difference is due to the resistance component. Linear approximations of the voltage differences for the radiative current component and the non-radiative current component can be represented as FIG. 9 and FIG. 10, respectively, where the slope in each graph represents the resistance value according to Ohm's formula. That is, FIG. 9 represents the resistance value ($R_S$) for the radiative current component, while FIG. 10 represents the resistance value ($R_A$) for the non-radiative current component.

Figure 9:
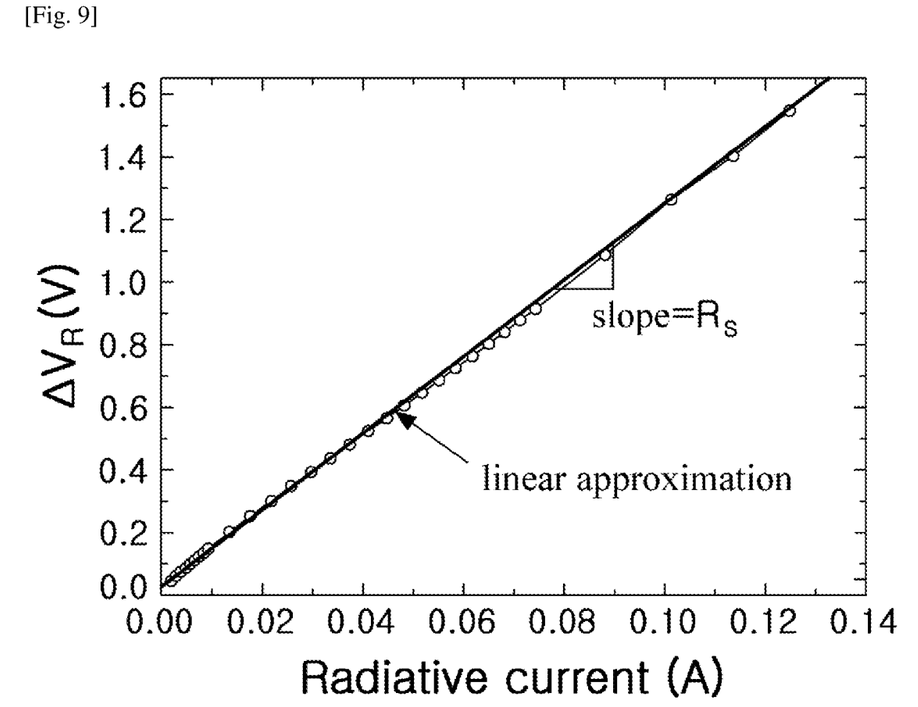
FIG. 9 is a graph representing the results of linearly approximating the voltage difference between a modeled radiative current component and a measured radiative current component.
Figure 10:
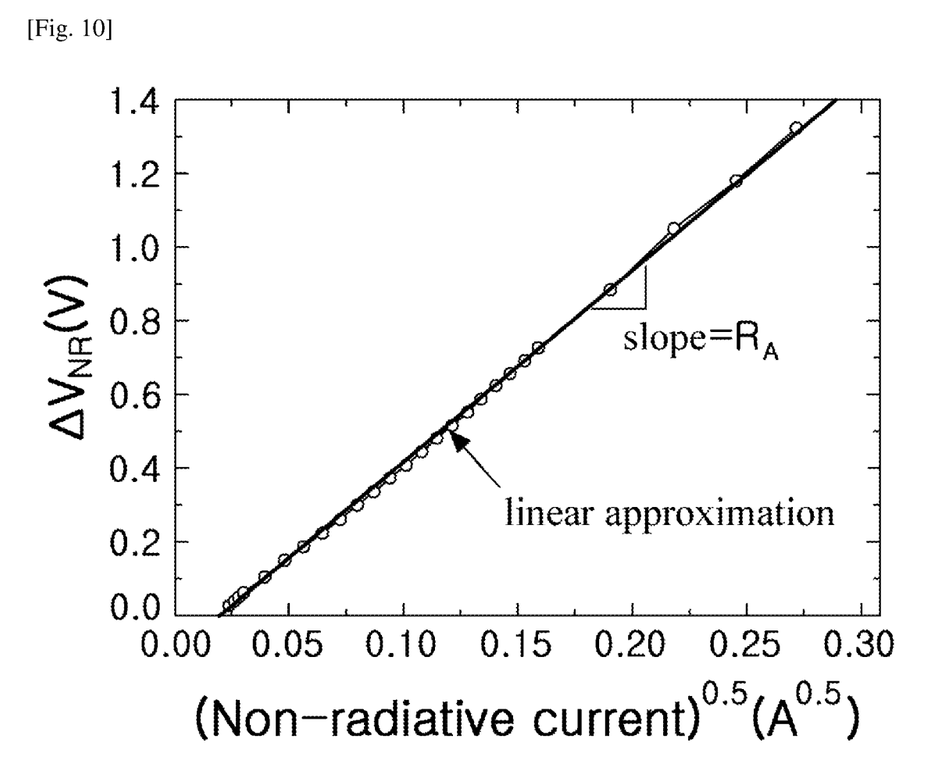
FIG. 10 is a graph representing the results of linearly approximating the voltage difference between a modeled non-radiative current component and a measured non-radiative current component.

According to FIG. 9, the voltage drop of the radiative current component increases linearly in proportion to the radiative current component. According to FIG. 10, the voltage drop of the non-radiative current component increases linearly in proportion to a square root of the non-radiative current component. Thus, if the voltage in [Equation 4] is expressed as a relationship of resistance and current, then the expression in [Equation 5] can be obtained.

$$I_R = I_{S,R} \exp\left[\frac{q(V - I_R R_S)}{k_B T}\right]$$ [Equation 5]

$$I_{NR} = I_{S,NR} \exp\left[\frac{q(V - \sqrt{I_{NR}} R_A)}{2k_B T}\right]$$

Therefore, the Shockley diode equation for the light-emitting diode can be expressed as [Equation 6] below.

$$I = I_{S,R} \exp\left[\frac{q(V - I_R R_S)}{k_B T}\right] + I_{S,NR} \exp\left[\frac{q(V - \sqrt{I_{NR}} R_A)}{2k_B T}\right]$$ [Equation 6]

While the descriptions referencing FIG. 2 through FIG. 10 use an example in which the resistance values for both the radiative current component and the non-radiative current component are computed, other embodiments can entail computing the resistance value for the radiative current component or the resistance value for the non-radiative current component selectively. Below, FIG. 11 is used to describe a method for measuring the resistance for the radiative current component, while FIG. 12 is used to describe a method for measuring the resistance for the non-radiative current component.

Figure 11:
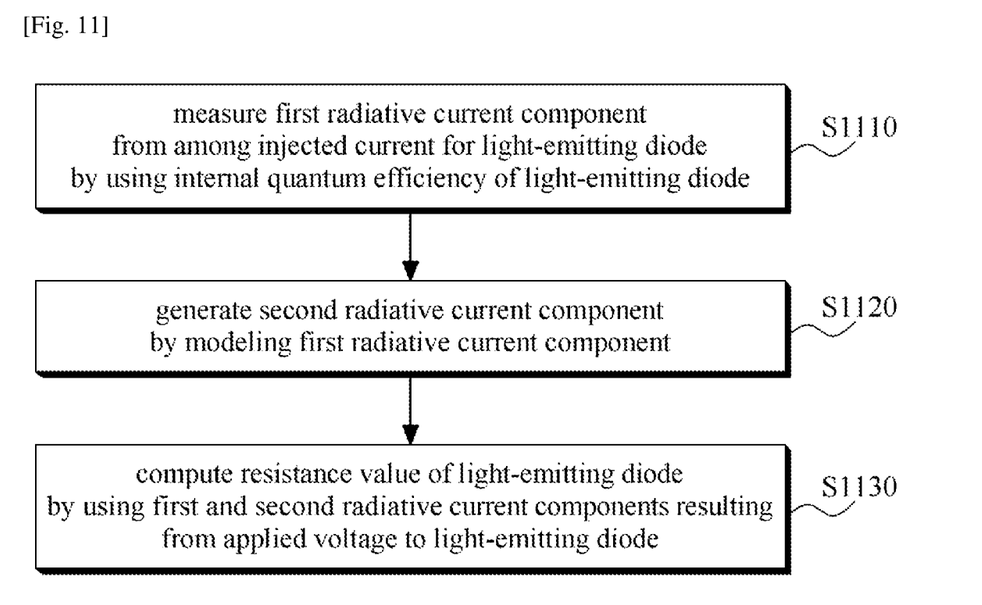
FIG. 11 illustrates a method for measuring resistance according to an embodiment of the invention.
Figure 12:
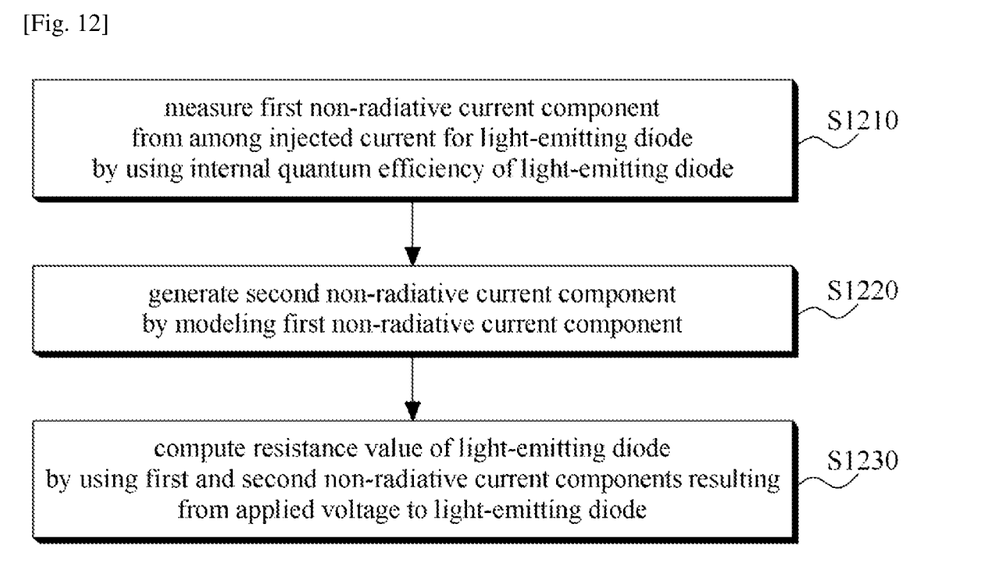
FIG. 12 illustrates a method for measuring resistance according to another embodiment of the invention.

FIG. 11 illustrates a method for measuring resistance according to an embodiment of the invention. FIG. 11 is used to describe, as an example, a method for measuring resistance used by the resistance measurement device described above with reference to FIG. 2.

The resistance measurement device may measure a first radiative current component from among the injected current for the light-emitting diode by using the internal quantum efficiency of the light-emitting diode (S1110). In one example, [Equation 1] can be used to measure the first radiative current component.

Then, the resistance measurement device may generate a second radiative current component by modeling the first radiative current component (S1120). The resistance measurement device can model the first radiative current component by using the ideality factor of the first radiative current component determined in a preconfigured injected current region, where the second radiative current component obtained as a result of the modeling can be expressed as in [Equation 4].

More specifically, the resistance measurement device may compute a multiple number of ideality factors of the first radiative current component according to the injected current and may select one ideality factor included in an injected current region from among the multiple ideality factors. Then, the selected ideality factor may be substituted into the Shockley diode equation for the first radiative current component to generate the second radiative current component.

Here, the injected current region can be selected as a region in which the amount of change of the ideality factor is within a threshold value, and a low-current region described with reference to FIG. 6 can be selected as an injected current region. Also, from among the ideality factors included in the low-current region, 1 can be selected as the ideality factor used for the modeling, but the ideality factor can vary in different embodiments.

The resistance measurement device may compute the resistance value of the light-emitting diode by using the first and second radiative current components resulting from the applied voltage to the light-emitting diode (S1130), and as described with reference to FIG. 7, the resistance value can be computed by approximating the difference between the voltage resulting from the first radiative current component and the voltage resulting from the second radiative current component.

In certain embodiments, the resistance measurement device can calculate the internal quantum efficiency of the light-emitting diode by using the intensity of the spontaneous emission of the light-emitting diode resulting from the injected current. Since the spontaneous emission refers to light that is emitted by electrons used for light emission, the internal quantum efficiency can be calculated using the spontaneous emission, and the internal quantum efficiency may be determined according to the intensity of the spontaneous emission.

FIG. 12 illustrates a method for measuring resistance according to another embodiment of the invention. FIG. 12 is used to describe, as an example, a method for measuring resistance used by the resistance measurement device described above with reference to FIG. 2.

The resistance measurement device may measure a first non-radiative current component from among the injected current for the light-emitting diode by using the internal quantum efficiency of the light-emitting diode (S1210). In one example, [Equation 1] can be used to measure the first non-radiative current component, and it is also possible to measure the first non-radiative current component by removing the radiative current component obtained by the internal quantum efficiency from the injected current.

Then, the resistance measurement device may generate a second non-radiative current component by modeling the first non-radiative current component (S1220). The resistance measurement device can model the first non-radiative current component by using the ideality factor of the first non-radiative current component determined in a preconfigured injected current region, where the second non-radiative current component obtained as a result of the modeling can be expressed as in [Equation 4].

More specifically, the resistance measurement device may compute a multiple number of ideality factors of the first non-radiative current component according to the injected current and may select one ideality factor included in an injected current region from among the multiple ideality factors. Then, the selected ideality factor may be substituted into the Shockley diode equation for the first non-radiative current component to generate the second non-radiative current component.

Here, the injected current region can be selected as a region in which the amount of change of the ideality factor is within a threshold value, and a low-current region described with reference to FIG. 6 can be selected as an injected current region. Also, from among the ideality factors included in the low-current region, 2 can be selected as the ideality factor used for the modeling, but the ideality factor can vary in different embodiments.

The resistance measurement device may compute the resistance value of the light-emitting diode by using the first and second non-radiative current components resulting from the applied voltage to the light-emitting diode (S1230), and as described with reference to FIG. 8, the resistance value can be computed by approximating the difference between the voltage resulting from the first non-radiative current component and the voltage resulting from the second non-radiative current component.

The technology described above can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the invention or can be a type of medium known to and used by the skilled person in the field of computer software. A computer-readable medium may include a hardware device that is specially configured to store and execute program instructions. Some examples may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. Thus, the spirit of the present invention is not to be confined to the embodiments described above but rather encompasses all equivalents and variations.

What is claimed is:

1. A device for measuring resistance of a light-emitting diode, the device comprising:
    a current component separation part configured to separate an injected current for the light-emitting diode into a radiative current component and a non-radiative current component by using an internal quantum efficiency of the light-emitting diode;
    a modeling part configured to model the radiative current component by using an ideality factor of the radiative current component determined in a preconfigured injected current region; and
    an approximation part configured to determine a resistance value for the radiative current component by approximating a difference between a voltage resulting from the radiative current component and a voltage obtained as a result of the modeling,
    wherein the current component separation part measures the radiative current component or the non-radiative current component according to the following equation:

$I_R = IQE \cdot I$ $I_{NR} = (1-IQE) \cdot I$ where, $I_R$ corresponds to the radiative current component, $I_{NR}$ corresponds to the non-radiative current component, I corresponds to the injected current, and IQE corresponds to the internal quantum efficiency,
    wherein the modeling part models the radiative current component by substituting the determined ideality factor of the radiative current component into a Shockley diode equation for the radiative current component.

2. A device for measuring resistance of light-emitting diode, the device comprising:
    a current component separation part configured to separate and injected current for the light-emitting diode into a radiative current component and a non-radiative current component by using an internal quantum efficiency of the light-emitting diode;
    a modeling part configured to model the non-radiative current component by using an ideality factor of the non-radiative current component determined in a preconfigured injected current region; and
    an approximation part configured to determine a resistance value for the non-radiative current component by approximating a difference between a voltage resulting from the non-radiative current component and a voltage obtained as a result of the modeling,
    wherein the current component separation part measures the radiative current component or the non-radiative current component according to the following equation:

$I_R = IQE \cdot I$ $I_{NR} = (1-IQE) \cdot I$ where, $I_R$ corresponds to the radiative current component, $I_{NR}$ corresponds to the non-radiative current component, I corresponds to the injected current, and IQE corresponds to the internal quantum efficiency,
    wherein the modeling part models the non-radiative current component by substituting the determined ideality factor of the non-radiative current component into a Shockley diode equation for the non-radiative current component.

3. The device for measuring resistance according to claim 1, further comprising:
    a current supply part configured to provide the injected current to the light-emitting diode; and
    a spectrophotometer configured to measure an intensity of a spontaneous emission of the light-emitting diode resulting from the injected current,
    wherein the internal quantum efficiency is determined according to the intensity of the spontaneous emission.

* * * * *